United States Patent
Gerlach et al.

(10) Patent No.: US 7,219,174 B2
(45) Date of Patent: May 15, 2007

(54) INTER-DEMUX COMMUNICATION THROUGH A POINT TO POINT INTERFACE

(75) Inventors: Paul M. Gerlach, Beaverton, OR (US); Samuel J. Peters, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 1000 days.

(21) Appl. No.: 10/366,047

(22) Filed: Feb. 12, 2003

(65) Prior Publication Data

US 2004/0013176 A1 Jan. 22, 2004

(51) Int. Cl.
*G06F 13/12* (2006.01)
*G06F 19/00* (2006.01)

(52) U.S. Cl. .......................... 710/65; 702/67; 370/536

(58) Field of Classification Search ............ 702/57–74; 370/524, 535–537; 710/65–69
See application file for complete search history.

(56) References Cited

U.S. PATENT DOCUMENTS

| 4,082,922 | A  | * | 4/1978  | Chu ............................ 370/230 |
| 4,835,770 | A  | * | 5/1989  | Hayano ....................... 370/396 |
| 5,726,990 | A  | * | 3/1998  | Shimada et al. ............ 370/536 |
| 6,615,148 | B2 | * | 9/2003  | Pickerd ........................ 702/66 |
| 6,748,335 | B2 | * | 6/2004  | Pickerd ........................ 702/66 |
| 6,807,496 | B2 | * | 10/2004 | Pickerd ........................ 702/67 |
| 6,892,150 | B2 | * | 5/2005  | Pickerd et al. ................ 702/67 |

* cited by examiner

*Primary Examiner*—Christopher Shin
(74) *Attorney, Agent, or Firm*—Thomas F. Lenihan

(57) ABSTRACT

A method and apparatus in which a plurality of demux processors propagates respective received sample streams to adjacent demux processors via an inter-demux bus; and wherein a final one of the plurality of demux processors propagates all of the respective received sample streams toward a next processing element such as a multi-drop bus (MDB) or system processor within a data acquisition device.

21 Claims, 6 Drawing Sheets

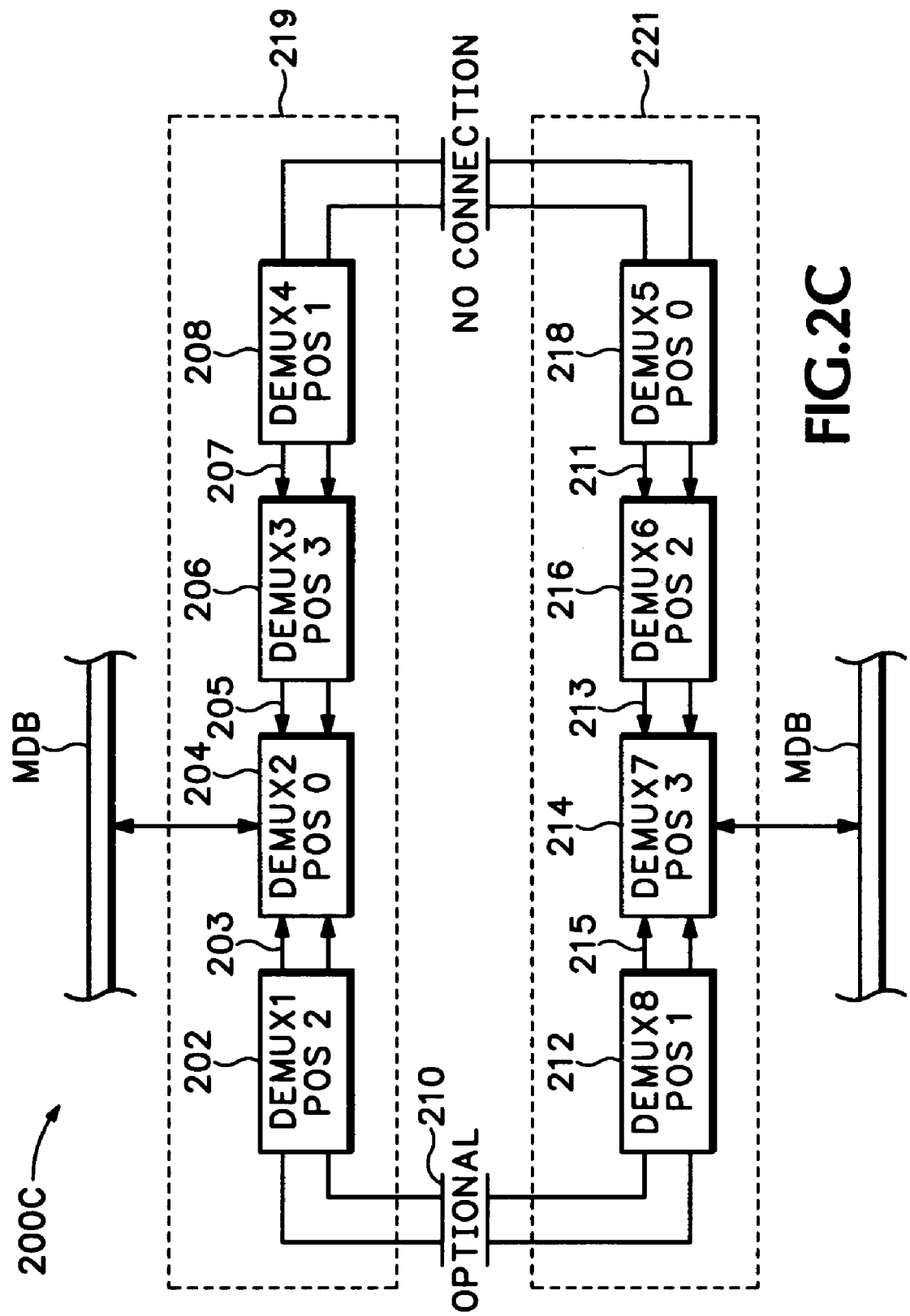

INTER-DEMUX COMMUNICATION THROUGH A POINT TO POINT INTERFACE

TECHNICAL FIELD

The invention relates generally to signal acquisition devices and, more specifically, to a system, method, and apparatus for acquiring data in a manner reducing demux processor loading of a multi-drop bus.

BACKGROUND OF THE INVENTION

Within the context of data acquisition devices such as digital storage oscilloscopes (DSOs) utilizing very high speed analog-to-digital ("A/D") converters, the effect of memory bandwidth constraints becomes a significant design factor. Specifically, memory devices available today cannot store data as rapidly as the data is produced by very high speed A/D converters. Moreover, in an interleaving technique, each of a plurality of A/D converters operates to digitize a common signal under test (SUT) according to respective phase-staggered clock signals to produce respective interleaved sample streams. Acquisition data provided by each of the A/D converters is stored in memory within respective demultiplex ("demux") processing elements. The acquisition data must be de-interleaved such that samples from each demultiplex processing element are collected and placed in their correct order according to sample time so that additional processing may be performed on the de-interleaved sample stream (e.g., rasterization). Unfortunately, each of the demultiplexer processing elements lacks a contiguous time record of the entire acquisition.

In current oscilloscopes the deinterleaving function is performed via a shared multi-drop bus that receives sample data from each of the demux processing elements. The sample data driven onto the multi-drop bus by the demux processing elements is de-interleaved by an additional processing unit (e.g., a processor or memory device cooperating with the bus) to provide thereby a de-interleaved acquired sample stream. Unfortunately, due to device loading and bandwidth constraints, the multi-drop bus architecture is unable to cope with increasing A/D converter speeds, increased numbers of demux processors and other system demands.

SUMMARY OF THE INVENTION

These and other deficiencies of the prior art are addressed by the present invention of a system, method and apparatus in which a plurality of demux processors propagates respective received sample streams to adjacent demux processors via an inter-demux bus; and wherein a final one of the plurality of demux processors propagates all of the respective received sample streams toward a next processing element such as a multi-drop bus (MDB) or system processor within a data acquisition device.

BRIEF DESCRIPTION OF THE DRAWINGS

The teachings of the present invention can be readily understood by considering the following detailed description in conjunction with the accompanying drawings, in which:

FIGS. 2A–2C depict exemplary embodiments of system configurations suitable for use in the present invention;

To facilitate understanding, identical reference numerals have been used, where possible, to designate identical elements that are common to the figures.

DETAILED DESCRIPTION OF THE INVENTION

The subject invention will be primarily described within the context of a signal acquisition device such as a digital storage oscilloscope (DSO). However, it will be appreciated by those skilled in the art that the invention may be advantageously employed in any signal acquisition, measurement or analysis device in which contemporaneous processing by multiple demux processing elements is employed.

Figure 1:
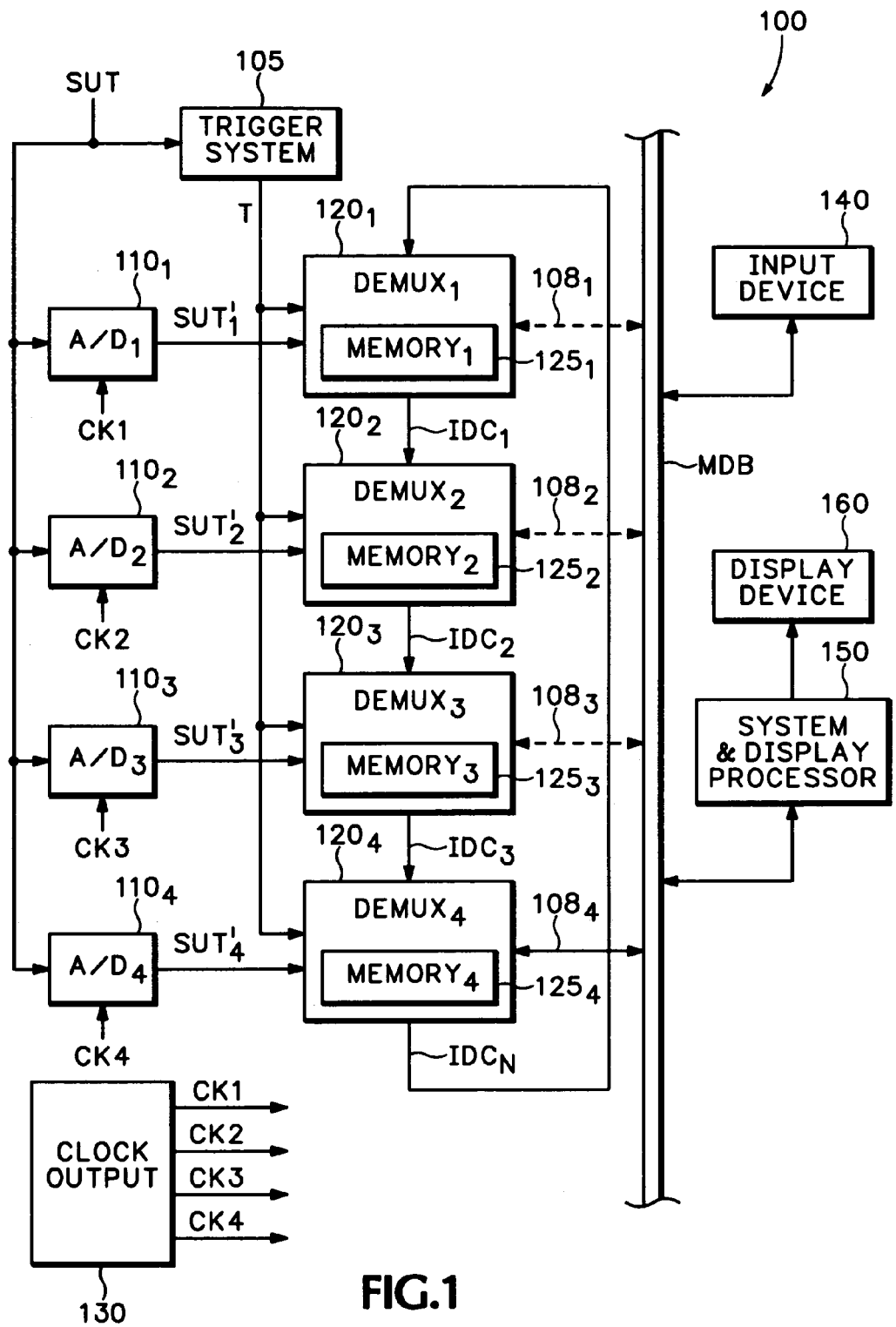
FIG. 1 depicts an embodiment of a high level block diagram of a signal acquisition system suitable for use with the present invention.

FIG. 1 depicts a high level block diagram of a signal acquisition system according to an embodiment of the invention. Specifically, the signal acquisition system 100 in FIG. 1 comprises a plurality (illustratively four) of analog to digital ("A/D") converters $110_1$ through $110_4$ (collectively A/D converters 110), a trigger system 105, a plurality of demux processing elements (illustratively four) $120_1$ through $120_4$ (collectively demux processing elements 120), a clock circuit 130, an input device 140, a system and display processor 150, and a display device 160.

A common signal under test ("SUT") is provided to each of the A/D converters 110 and the trigger system 105. Additionally, each of the A/D converters $110_1$ through $110_4$ receives a respective common frequency and/or pulse width clock signal $CK_1$ through $CK_4$ provided by the clock circuit 130. Each of the clock signals $CK_1$ through $CK_4$ is 90 degrees ($\mu/2$) out of phase with respect to an adjacent clock signal. In this manner, each of the A/D converters 110 operates to sample the SUT at a unique moment in time or phase, such that the sample streams produced by the respective A/D converters comprise an interleaved representation of the digitized SUT.

Each demux processing element 120 includes a respective memory element 125 for storing acquired samples. Each of the first $120_1$, second $120_2$ and third $120_3$ demux processing elements 120 communicates data (such as its respective received data samples) to an adjacent demux processing element via a respective inter-demux connection ("IDC"). Optionally, the fourth $120_4$ demux processing element communicates data to the first demux processing element $120_1$, a respective IDC. Specifically, in one embodiment of the invention, a first data path $IDC_1$ communicates data between the first $120_1$ and second $120_2$ demux processing elements, a second data path $IDC_2$ communicates data between the second $120_2$ and third $120_3$ demux processing elements, a third data path $IDC_3$ communicates data between the third $120_3$ and fourth $120_4$ demux processing elements, and an optional fourth data path $IDC_4$ communicates data between the fourth $120_4$ and first $120_1$ demux processing elements.

The memory 125 associated with each demux processing element 120 is sufficient to store at least a respective portion of the samples record received from a respective A/D converter 110. The memory may store a portion or all of the samples needed to form a sample record. A sample record comprises those samples occurring within a time frame consistent with a duration parameter selected by a user. The duration parameter describes the time axis of an oscilloscope display frame, where voltage amplitude is displayed as a function of time for an acquired SUT. In the embodiment thus described with respect to FIG. 1, since each of the demux processors 120 processes 25% of the samples representing the commonly digitized SUT, each of the memories 125 supports 25% of a subsequent record formed using the respective acquired samples. In the case of each A/D converter 110 processing a respective non-common SUT, each of the memories 125 within the demux processors 120 supports a full sample record. It is noted that the amount of memory may be reduced by using first in first out ("FIFO") buffering techniques wherein the memory 125 receives digitized samples while contemporaneously transmitting previously received digitized samples to an adjacent demux processor via the corresponding IDC.

The invention operates to shift sample records (and/or sample record portions) between each non-final demux processing element and the respective next adjacent demux processing element via its respective IDC path. Prior to each memory shift, each demux processing element 120 stores its received sample(s) into its respective memory 125. Thus, in the embodiment of FIG. 1, after four sample shift operations, the fourth demux processing element 120$_4$ will include one sample from each of the four A/D converters arranged in a substantially de-interleaved manner.

In a preferred embodiment of the invention, one (illustratively the fourth 120$_4$) of the demux processors communicates a de-interleaved sample stream record to the multi-drop bus ("MDB"). In this manner, the bandwidth demands placed upon the multi-drop bus are diminished such that extremely high sample throughput rates may be achieved. However, more than one demux processor 120 may communicate with the MDB, as indicated by the dashed lines 108.

In the sample interleave mode, each demux processing element 120 is optionally sent a command indicating which sample interleave position its respective A/D converter 110 is sampling, thus defining its relative position to the other demux processing elements 120. Additionally, all demux processors optionally receive record unwrapping information to indicate which sample of all available samples should be considered to be a "first" sample. In one embodiment, one demux processing element 120 is designated as an "initial" demux, one is designated as a final demux, and the other demux processing elements 120 are designated "intermediary." The "initial" demux processing element propagates data to an adjacent "intermediary" demux processing element and so on towards the "final" demux processing element. The data propagated initially by the "initial" demux processing element includes invalid portions within the digital word (i.e., portions containing no information). After N conversions cycles every portion of the digital word includes valid data (where N is the total number of demux processors).

The "final" demux processing element rearranges the memory portions received via the IDC as necessary (e.g., constructs new data structures with appropriately rearranged or de-interleaved samples). The "final" demux processing element provides the de-interleaved samples to various other processing elements via the MDB or alternatively another IDC line.

In one mode of operation, the final demux processing element (illustratively fourth demux processing element 120$_4$) rearranges the sample data provided by the initial and intermediate demux processing element to provide a de-interleaved sample record for propagation via the multi-drop bus. In an alternate embodiment, the final demux processor couples the sample data received via the IDC directly to the MDB for subsequent rearranging and/or processing by, for example, the system and display processor 150.

The display processor 150 includes input/output circuitry, processor circuitry, and memory as appropriate for performing various system management and display processing functions. Such system management functions may comprise, for example, extracting and/or de-interleaving sample streams and/or records received via the MDB, rasterizing the de-interleaved sample streams to produce thereby waveform data, and providing the rasterized or waveform data to a display device 160 for presentation to a user.

The display device 160 may comprise a cathode ray tube ("CRT"), liquid crystal display ("LCD") or other device. The display device 160 may also comprise a touch screen device such that a display device 160 provides both user input and user output functionality. The system 100 also comprises an input device 140, illustratively a keypad or a pointing device. Within the context of a touch screen display device 160, the touch screen display device 160 also performs as an input device 140. Input device 140 is depicted as cooperating with the system and display processor 150 via communications through the MDB, though direct communications may also be provided.

Generally speaking, the operations of the system and display processor 150, input device 140, and display device 160 enable the generation and presentation of a user interface as well as interaction with a user to elect various system parameters, such as sweep speed, duration, time per division, volts per division and so on. Additionally, in one embodiment of the invention the various input channel providing signals under test to the A/D converters may be configured by a user interaction with the user interface supported by the system and display processor 150.

The signal acquisition system 100 of FIG. 1 is depicted as receiving only one SUT. However, it will be appreciated that many signals under test may be received and processed by the signal analysis device. Each signal under test is preferably processed using a respective group of A/D converters 110, where each respective A/D converter may be clocked using the clock signal CLK provided by the clock circuit 130 or some other clock source. Each of the additional digitized signals under test are coupled to respective demux processing elements, which operate in the manner described herein to provide a de-interleaved sample stream via the MDB.

It will also be appreciated by those skilled in the art and informed by the teachings of the present invention that more or fewer A/D converters 110 and respective demux processing elements 120 may be provided within the context of the present invention. In the case of N A/D converters (where N is an integer greater than one), the phase difference (PD) between the phase staggered clock signals is calculated as PD=$2\pi/N$. The use of four A/D converters and respective demux processing elements is for exemplary purposes only.

Thus, the operation of a plurality of demux processing units 120 may be adapted to conform to many topologies suitable for use within the context of a signal acquisition device. By avoiding the condition where each demux processing unit 120 communicates with the multi-drop bus, the bandwidth requirements of the multi-drop bus are reduced since, for example, bus contentions are reduced and acquired sample streams may be processed prior to being driven into the MDB.

The IDC paths may comprise high speed serial data links or high speed parallel data links. The IDC may implement any of a plurality of known data communication protocols including synchronous and/or asynchronous protocols such that the demux processors may propagate between themselves and, subsequently, to the MDB in a manner avoiding a data transfer bottleneck condition.

To avoid a data transfer bottleneck with the demux processors 120, the demux processors 120 optionally implement a decimation and/or sample reduction mode of operation. For example, the demux processors 120 may include sub-sampling, averaging peak detection and/or other known decimation techniques to reduce the number of samples required to be subsequently processed. In the case of the interleaved sampling modes discussed above, the sub-sampling processes of the demux processors 120 are preferably coordinated such that the temporal integrity (i.e., sample spacing) of a resulting de-interleaved sample stream is maintained.

The demux processors 120 are optionally responsive to a trigger signal T produced by the trigger system 105 to initiate the acquisition and processing of their respective sample streams. In the case when a pre-trigger view is desired (e.g., a trigger hold-off condition), the demux processors 120 continually operate and, when the trigger condition occurs, responsively perform decimation and/or demux processing operations as discussed above.

Figure 2A:
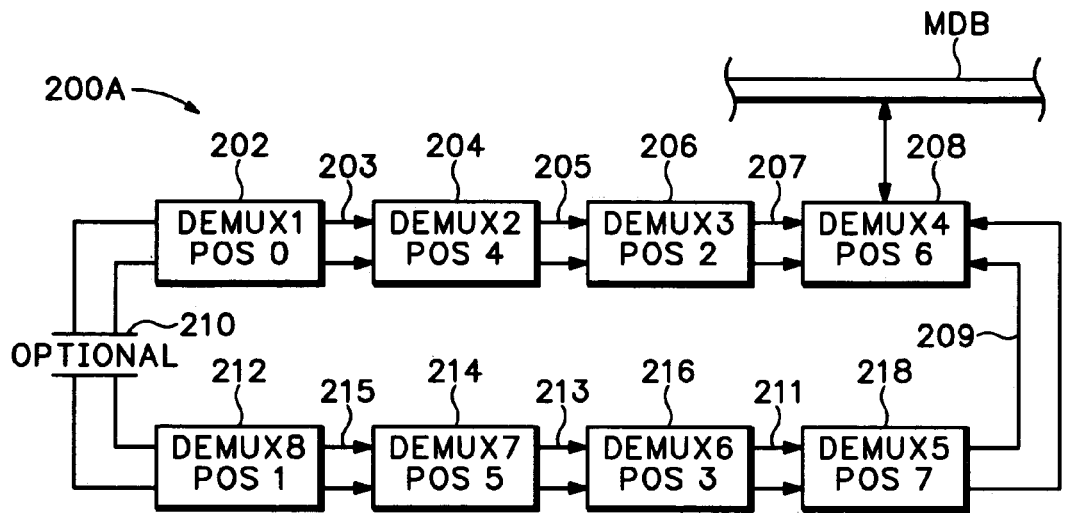
Figure 2B:
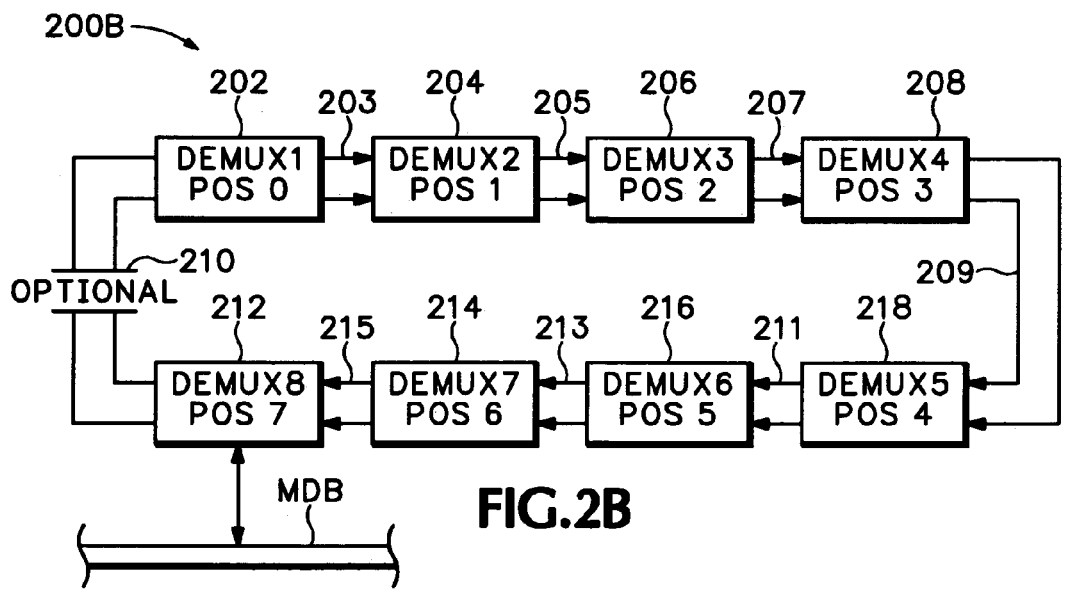

FIGS. 2A–2C depict exemplary embodiments of system configurations suitable for use in the present invention. Since each of FIGS. 2A–2C each depict eight (8) demux processing elements, there are also eight (8) corresponding A/D converters which operate according to a phase stagger of $\pi/4(2\pi/N$ where $N=8)$. However, this depiction of eight (8) demux processing elements is for illustrative purposes only and not intended in any way to limit the scope of the invention, since more or fewer demux processing elements may be used.

FIG. 2A depicts a system configuration wherein each demux stores the respective information at a respective position in an eight (8) position data word. For example, in the case of 8-bit A/D converters, the eight position data word may comprise a 64-bit word in which each of 8 bytes forming the 64 bit word have a position associated with a particular A/D converter. It should be noted that there is no requirement to transmit the entire 64-bit word in parallel via the IDC; rather, the 64-bit word may be transferred by any of the serial and/or parallel data transfer techniques discussed above. This may be referred to as a "packed" data structure.

Specifically, $demux_1$ 202 stores information at position 0, $demux_2$ 204 at position 4, $demux_3$ at position 2, $demux_4$ at position 6, $demux_5$ at position 7, $demux_6$ at position 3, $demux_7$ at position 5, and $demux_8$ at position 1. Further, $demux_1$ is adjacent to and interconnected with $demux_2$ via interconnection 203, $demux_2$ is adjacent to and interconnected with $demux_3$ via interconnection 205, $demux_3$ is adjacent to and interconnected with $demux_4$ via interconnection 207, $demux_4$ is adjacent to and interconnected with $demux_5$ via interconnection 209, $demux_5$ is adjacent to and interconnected with $demux_6$ via interconnection 211, $demux_6$ is adjacent to and interconnected with $demux_7$ via interconnection 213, $demux_7$ is adjacent to and interconnected with $demux_8$ via interconnection 215. In addition, $demux_1$ is optionally adjacent to and interconnected with $demux_8$ via interconnection 210.

Each demux receives respective acquired samples, stores the sample within internal memory 125, inserts the sample into its allocated position of the data structure, and sends the data structure to the adjacent demux via the appropriate interconnection. For example, $demux_4$ receives from $demux_3$ a data structure having samples in positions 0, 4, and 2; and from $demux_5$ a data structure having samples in positions 1, 5, 3, and 7. $Demux_4$ inserts its sample with the received samples such that all positions in the data structure are filled. $Demux_4$ may either transmit the complete data structure to the MDB for storage in acquisition memory (not shown) or in another embodiment, $demux_4$ may store the data structure within its own internal memory. It will be appreciated that while the various demux modules 120 may operate using the position-assigned mode discussed herein, all that is strictly necessary is that each demux propagates some or all of its received samples toward an adjacent demux for subsequent propagation to the multi-drop bus and/or system and display processor 150.

If $demux_1$ and $demux_8$ are interconnected, either demux 1 or 8 is designated as the first demux processing elements and all other demux processing elements (demux processing elements 2, 3, 5, 6, 7, and either 1 or 8) are designated as intermediate demux processors (i.e., they insert their respective sample into the data structure and pass the data structure to an adjacent demux processing element).

In yet another embodiment, $demux_1$, and $demux_8$ are not connected. This is a non-ring configuration (i.e., $demux_1$-$demux_3$ will not obtain the information from $demux_8$-$demux_5$). In this embodiment, $demux_4$ 208 is designated as the final demux processing element and both $demux_1$ and $demux_8$ may be designated as the first demux processing element in their respective series of demux processing elements. In this configuration, $demux_4$ is able to obtain a complete frame faster, because it receives samples from two downstream paths towards $demux_4$, than if there were only a single downstream path towards $demux_4$. Although this embodiment describes a final designated demux processing element as receiving samples from two series of demux processing elements this description is for illustrative purposes only and not intended to limit the scope of the invention. A person skilled in the art appreciates that the invention may be used in conjunction with multiple series of demux processing elements.

FIG. 2B depicts another embodiment 200B wherein $demux_1$ 202 stores information at position 0, $demux_2$ 204 at position 1, $demux_3$ at position 2, $demux_4$ at position 3, $demux_5$ at position 4, $demux_6$ at position 5, $demux_7$ at position 6, and $demux_8$ at position 7. Further, $demux_1$ is adjacent to and interconnected with $demux_2$ via interconnection 203, $demux_2$ is adjacent to and interconnected with $demux_3$ via interconnection 205, $demux_3$ is adjacent to and interconnected with $demux_4$ via interconnection 207, $demux_4$ is adjacent to and interconnected with $demux_5$ via interconnection 209, $demux_5$ is adjacent to and interconnected with $demux_6$ via interconnection 211, $demux_6$ is adjacent to and interconnected with $demux_7$ via interconnection 213, and $demux_7$ is adjacent to and interconnected with $demux_8$ via interconnection 215.

FIG. 2B emphasizes the invention's ability, in a ring type configuration, to designate any two demux processing elements as the first and final demux processing elements, when the optional connection 210 connects $demux_1$ with $demux_8$. For example, $demux_1$ may be designated as the first demux processing element and $demux_8$ may be designated as the final demux processing element. In this instance all other demux processing elements are designated as intermediates. In the present configuration, $demux_1$, $demux_2$, $demux_3$, $demux_4$, $demux_5$, $demux_6$, and $demux_7$ insert their respective sample into their respective positions within the data structure and transmit the data structure to an adjacent demux towards $demux_8$. Upon receipt of the data structure, $demux_8$ stores its sample into the data structure and may either transmit the complete data structure to the MDB for storage in acquisition memory (not shown) or in another embodiment, $demux_8$ may store the data structure within its own internal memory.

FIG. 2C depicts another embodiment of the invention. System 200C exemplifies the invention's applicability with respect to multi-channel signal testing. For simplicity, FIG. 2C depicts a first channel 219 and a second channel 221. Although only two channels are depicted, that depiction is not intended in any way to limit the scope of the invention. A person of ordinary skill in the art will appreciate that the invention may be used with more channels than those depicted in FIG. 2C.

In FIG. 2C, $demux_1$-$demux_4$ are used to receive samples from channel 219 while $demux_5$-$demux_8$ are used to receive samples from channel 221. To analyze a SUT in the first channel 219, $demux_1$ 202 stores information at position 2, $demux_2$ 204 at position 0, $demux_3$ at position 3, and $demux_4$ at position 1. Further, $demux_1$ is adjacent to and interconnected with $demux_2$ via interconnection 203, $demux_2$ is adjacent to and interconnected with $demux_3$ via interconnection 205, $demux_3$ is adjacent to and interconnected with $demux_4$ via interconnection 207.

Analysis of a different SUT in the second channel 221 occurs using the second group of demux processing elements. $Demux_5$ stores information at position 0, $demux_6$ at position 2, $demux_7$ at position 3, and $demux_8$ at position 1. $Demux_5$ is adjacent to and interconnected with $demux_6$ via interconnection 211, $demux_6$ is adjacent to and interconnected with $demux_7$ via interconnection 213, and $demux_7$ is adjacent to and interconnected with $demux_8$ via interconnection 215.

In the first channel 219, $demux_2$ has been designated as the final demux processing element while either demux, or $demux_4$ are designated as the first demux. In the second channel 221, $demux_7$ is designated as the final demux while either $demux_5$ or $demux_8$ is designated as the first demux processing element. For brevity, the transition of either respective data structure along either downstream path will not be discussed. $Demux_2$ and $demux_7$, upon receipt of the respective data structure associated with their respective channel, store their respective samples in the respective data structure. $Demux_2$ and $demux_7$ may either transmit the complete data structure to the MDB for storage in acquisition memory (not shown) or in another embodiment, $demux_2$ and $demux_7$ may store the data structure for their respective channel within their own respective internal memories. This embodiment illustrates that the invention can be used to analyze more than one channel concurrently and that the SUTs may be compared, e.g., subtracting or adding the SUTs.

Figure 3:
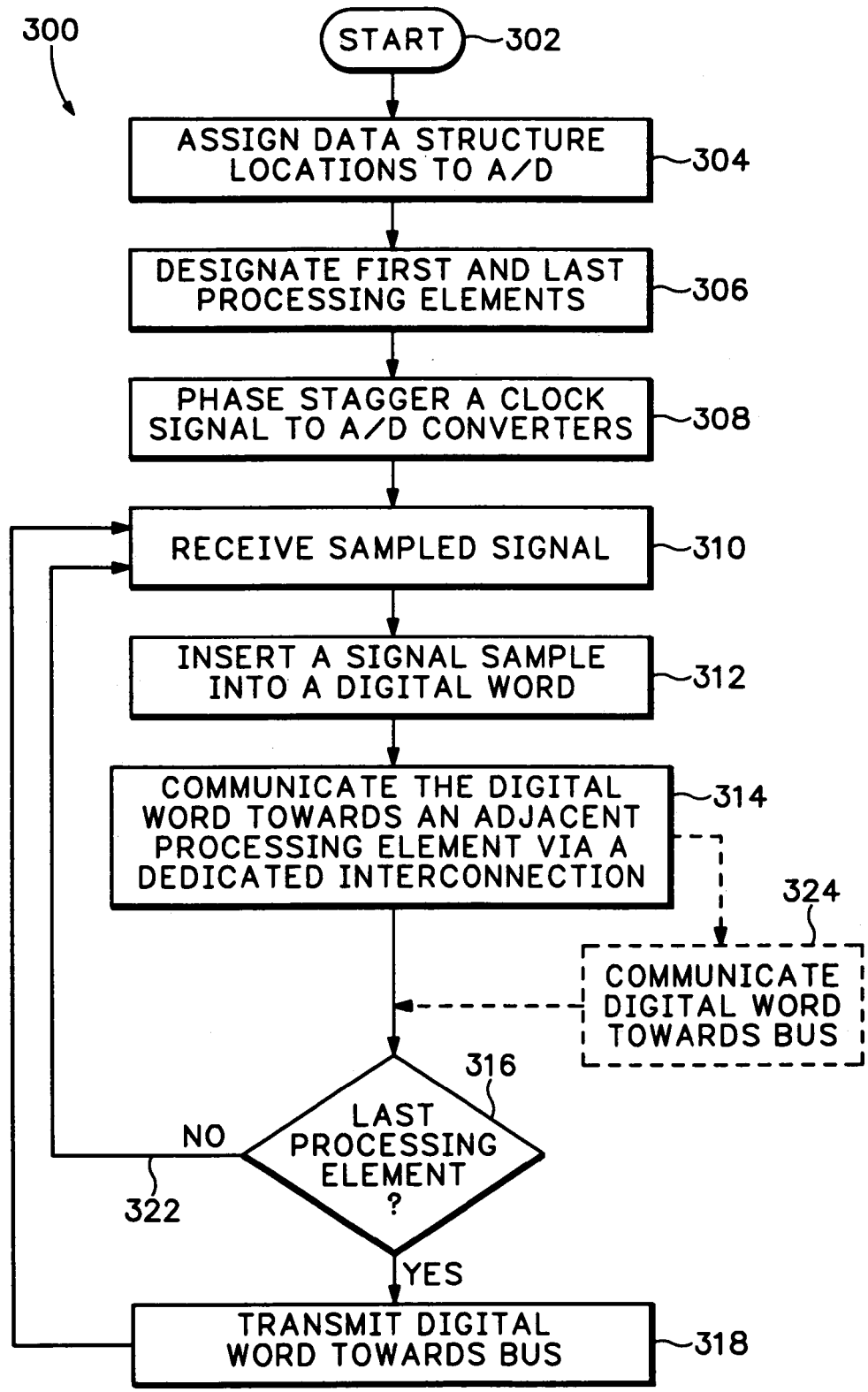
FIG. 3 depicts a flow diagram of a method according to the present invention.

FIG. 3 depicts a flow diagram of a method according to an embodiment of the present invention. The method 300 of FIG. 3 will be described within the context of the four A/D converter and demux processor pairs described above with respect to FIG. 1, wherein each of the A/D converters operates in a phase-staggered manner to digitize a common SUT and the demux processors operate to propagate packed data via their IDC paths to adjacent demux processors. It will be appreciated by those skilled in the art and informed by the teachings of the present invention that more or fewer A/D converter and demux processing element pairs may be used, that a packed or non-packed data format for the IDC may be used, that each A/D converter may process a respective or non-common SUT and, more generally, that other options and variations discussed above with respect to FIGS. 1 and 2 may be used to modify the method 300 discussed herein with respect to FIG. 3. It is noted that steps 302–308 of the method 300 describe initial set-up steps appropriate to the system 100 of FIG. 1; while steps 310–318 describe steps appropriate to the operation of any of the demux processors 120 within the system 100 of FIG. 1.

The method 300 begins at step 302 and proceeds to step 304, where a location of a data structure for each A/D 106 is assigned. At step 306, the system designates a first demux processing element and a final demux processing element. The remaining demux processing elements in the system are designated as intermediates. At step 308, the clock 130 causes the generation of phase staggered digital signal from each of the respective A/D converters 110.

At step 310, each A/D 110 generates a respective sample for use by its respective demux processor 120, transmits the respective sample to its respective demux processor 120. Each respective demux processor 120 stores its respective received sample within its internal memory 125.

At step 312, a demux processing element 120 inserts a sample into a corresponding location of a digital word presently within its memory 125.

At step 314, each demux processing element 120 communicates its digital word towards an adjacent demux processing element via its IDC. Thereafter, each demux processing element 120 receives another sample for storage in its corresponding location of the digital word within it memory 125.

At step 316, if the particular demux processing element is the final demux processing element, then the method proceeds to step 318 where the final demux processing element transmits its digital word toward the MDB. The method then proceeds to step 312 to process the next sample. If the demux processing element has not been designated as the final processing element, the method proceeds directly to step 312 to process the next sample. In various embodiments, the digital word may be stored in acquisition memory or in memory located in the demux processing element.

At an optional step 324, any (i.e., first, intermediate, or final) demux processor may communicate its digital word towards the MDB.

Figure 4:
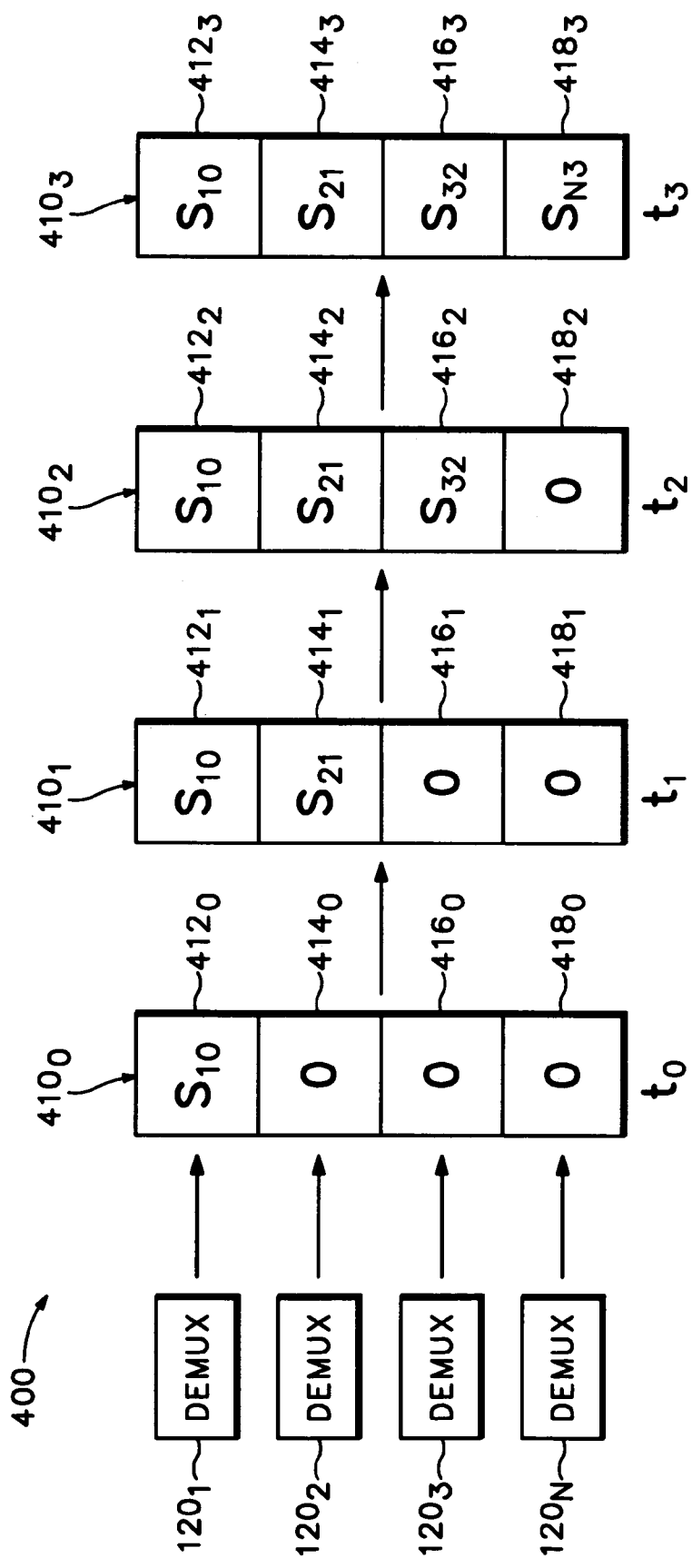
FIG. 4 depicts an embodiment of a data structure suitable for use in the signal acquisition system of FIG. 1.

FIG. 4 depicts an embodiment of a data structure suitable for use in the signal analysis system of FIG. 1. The embodiment comprises a data structure 410 having, illustratively, four (4) locations 412, 414, 416, and 418 for storing sample information, and four (4) demux processing elements $120_1$, $120_2$, $120_3$, and $120_n$ providing the sample information for each location. FIG. 4 depicts the placement of sample information into the data structure 410 at each of four (4) time or sample intervals. Each of the corresponding A/Ds has already been assigned a position for the placement of their respective sample within a data structure and has a demux associated therewith.

Although FIG. 4 illustrates the use of the invention with four (4) demux processing elements that illustration is not intended in any way to limit the scope of the invention.

At time $t_0$, the data structure 410 ("$410_0$"), is modified as follows: first demux processing element $120_1$ inserts a first sample $S_{10}$ into assigned location $412_0$. Demux $120_1$ then transmits, via dedicated interconnection $IDC_1$, the data structure $410_0$ to demux processing element $120_2$.

At time $t_1$, the data structure 410 ("$410_1$"), is modified as follows: intermediate demux processing element $120_2$ inserts a second sample $S_{21}$ into assigned location $414_1$. Demux $120_2$ then transmits, via dedicated interconnection $IDC_2$, the data structure $410_1$ to demux processing element $120_3$.

At time $t_2$, the data structure 410 ("$410_2$"), is modified as follows: intermediate demux processing element $120_3$ inserts a third sample $S_{32}$ into assigned location $416_2$. Demux $120_3$ then transmits, via dedicated interconnection $IDC_3$, the data structure $410_2$ to demux processing element $120_4$.

At time $t_3$, the data structure 410 ("$410_3$"), is modified as follows: final demux processing element $120_4$ inserts a fourth sample $S_{43}$ into assigned location $418_4$. Demux $120_n$ now has a full record and may transmit the record to the MDB or to another processor (e.g., system and display processor 150).

Figure 5:
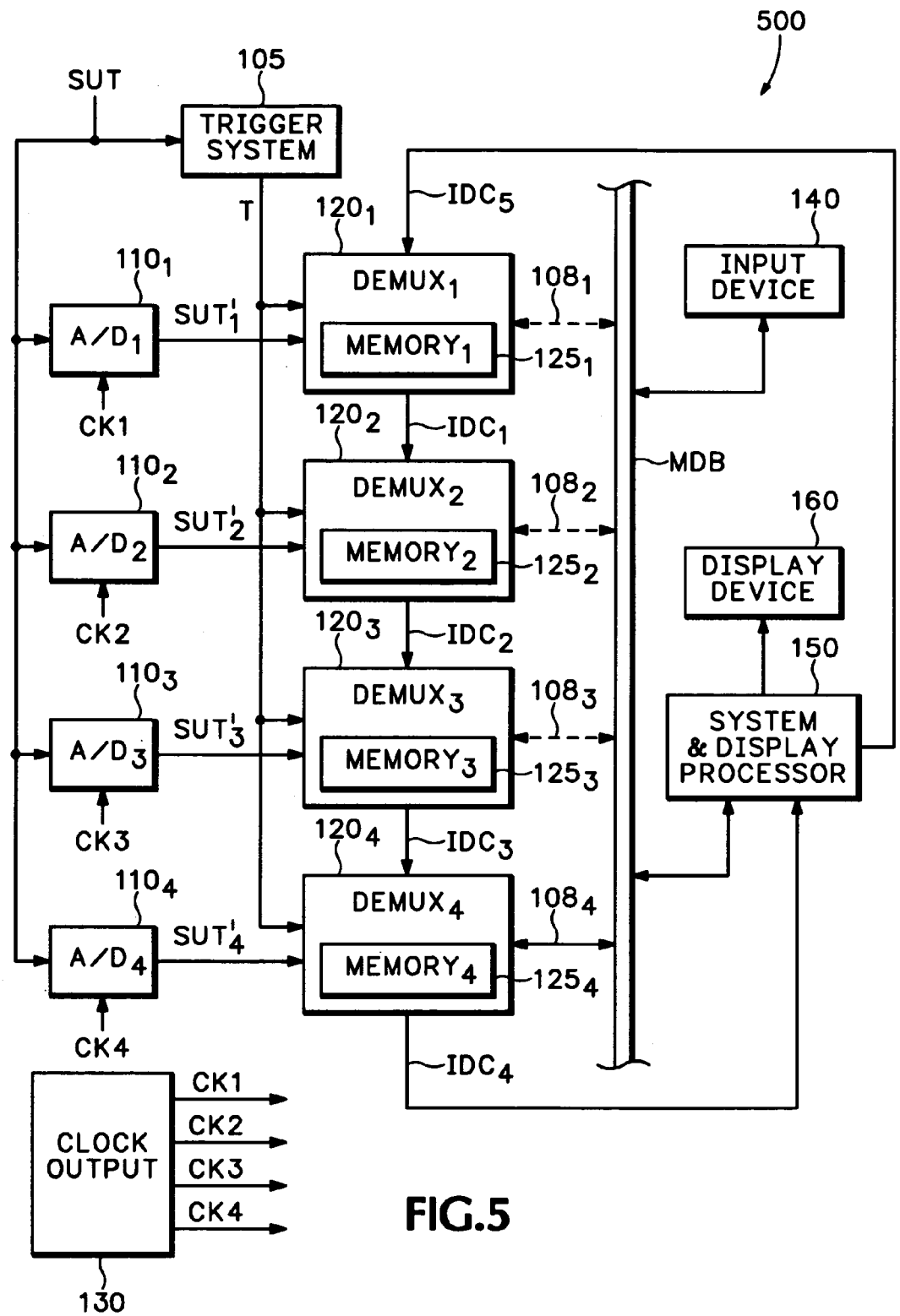
FIG. 5 depicts another embodiment of a high level block diagram of a signal analysis system suitable for use with the present invention.

FIG. 5 depicts another embodiment of a high level block diagram of a signal analysis system suitable for use with the present invention. In this embodiment, the interconnections and functions of the elements depicted in FIG. 1 are similar to the interconnections and functions of the elements depicted in FIG. 5. For brevity, only the differences will be discussed. For example, FIG. 5 depicts demux$_4$ directly connected to the system and display processor 150 via $IDC_4$ and, optionally, to the MDB. The system and display processor interconnected to demux$_1$ via $IDC_5$. This exemplary embodiment indicates that elements other than demux processing elements 120 may be within a ring, such as a ring passing data according to the various data structures discussed herein.

Although the invention has been described herein with respect to the insertion, by a demux processing element, of a digitized sample into a data word the invention is not limited for use with a data structure (i.e., a data word). Specifically, the invention may be practiced without the constraints of a data word framework. For example, in one embodiment, a system comprises four (4) demux processing elements (demux$_1$, demux$_2$, demux$_3$, and demux$_4$) where each of the adjacent demux processing elements are interconnected via respective IDC lines. The system informs each demux processing element of its position with respect to the other demux processing elements. The third demux processing element demux$_3$ has been instructed that there are two other processing elements, demux$_1$ and demux$_2$, upstream. Upon receipt of the samples from demux$_1$ and demux$_2$, demux$_3$ inserts its sample after every two samples.

In an alternate embodiment, each of the demux processing elements 120 are not identical. Specifically, in alternate embodiments the amount of processing power, the amount of input/output bandwidth, the amount of memory and other parameters of the demux processing elements 120 may be adjusted depending upon the processing load experienced by a particular demux processing element 120. For example, the first demux processing element $120_1$ does not process the same amount of data as the final demux processing element $120_4$. Thus the processing requirements of the first demux processing element $120_1$ are not as great as the final demux processing element $120_4$.

Although various embodiments which incorporate the teachings of the present invention have been shown and described in detail herein, those skilled in the art can readily devise many other varied embodiments that still incorporate these teachings.

What is claimed is:

1. A system, comprising:
   a plurality of demux processors wherein each of the demux processors propagates a respective received sample stream to an adjacent demux processor via an inter-demux bus;
   wherein a final one of said plurality of demux processors propagates all of said respective received sample streams toward a next processing element.

2. The system of claim 1, wherein said next processing element comprises a multi-drop bus (MDB).

3. The system of claim 1, wherein said next processing element comprises a system processor within a data acquisition device.

4. The system of claim 1 wherein said inter-demux bus comprises one of a serial bus or a parallel bus.

5. The system of claim 1, further comprising:
   a plurality of analog-to-digital (A/D) converters for digitizing a common signal under test (SUT) according to respective phase-staggered clock signals to produce respective sample streams, said respective sample streams being communicated to corresponding demux processors.

6. The system of claim 5, wherein:
   said system comprises N A/D converters, where N is an integer greater than one; and
   each of said respective phase-staggered clock signals are temporally separated from an adjacent phase-staggered clock signal by $2\pi/N$.

7. The system of claim 1, further comprising:
   a plurality of analog-to-digital (A/D) converters, for digitizing respective signals under test (SUT) to produce respective sample streams, said respective sample streams being communicated to corresponding demux processors.

8. The system of claim 1, wherein:
   each of said plurality of demux processors propagates received samples to an adjacent demux processor within a corresponding portion of a data structure, said data structure having portions corresponding to each of said plurality of demux processors, said final one of said demux processors propagating said data structure including corresponding portions to a first of said plurality of demux processors.

9. The system of claim 1, further comprising:
   a second plurality of demux processors, wherein each of the second plurality of demux processors propagate their respective received sample stream to an adjacent one of the second plurality of demux processors via an inter-demux bus;
   wherein a final one of said second plurality of demux processors propagates all of said respective received sample streams toward a next processing element.

10. The system of claim 9, wherein one demux processor operates as a final one of both of said first and second pluralities of demux processors.

11. The system of claim 10, wherein said plurality of demux processors acquires samples under test in a first channel and said second plurality of demux processors acquires samples under test in a second channel.

12. The system of claim 1, wherein:
   said non-final demux processors propagate to said final demux processor respective portions of a sample record frame;

said final demux processor arranging the respective portions of said sample record frame for all demux processors to provide an entire sample record frame to said next processing element.

13. The system of claim 1, wherein said demux processors comprises substantially similar demux processing devices.

14. The system of claim 1, wherein each of said demux processors has at least one of a processing capability and a memory capability selected in response to, respectively, an expected processing load and an expected memory requirement.

15. A test and measurement instrument, comprising:
a plurality of analog to digital (A/D) converters, for generating respective digital sample streams in response to at least one signal under test (SUT);
a plurality of demux processors, wherein each of said demux processors receives a sample stream from a respective A/D converter and propagates the received sample stream to an adjacent demux processor via an inter-demux bus;
wherein a final one of said plurality of demux processors propagates all of said respective received sample streams toward a next processing element.

16. The test and measurement instrument of claim 15, wherein said next processing element comprises at least one of a multi-drop bus (MDB) and a system processor.

17. The test and measurement instrument of claim 16, wherein said system processor rasterizes said respective received sample streams to from a signal suitable for use by a display device.

18. A method, comprising:
receiving, at each of a plurality of demux processors, a respective sample stream;
propagating, from each of said plurality of demux processors to a respective adjacent demux processor via an inter-demux bus, said received respective sample stream;
wherein a final one of said plurality of demux processors propagates all of said respective received sample streams toward a next processing element.

19. The method of claim 18, wherein:
non-final demux processors propagate to said final demux processor respective portions of a sample record frame;
said final demux processor arranging the respective portions of said sample record frame for all demux processors to propagate thereby an entire sample record frame to said next processing element.

20. The method of claim 18, further comprising:
digitizing at least one signal under test (SUT) using a plurality of analog-to-digital (A/D) converters to produce said sample streams received by said demux processors.

21. The method of claim 20, further comprising:
providing a corresponding plurality of phase staggered clock signals to said plurality of A/D converters, wherein each of N provided phase staggered clock signals is temporally offset from an adjacent phase-staggered clock signal by $2\pi/N$, where N is an integer greater than one.

* * * * *